(12) United States Patent
Sun et al.

(10) Patent No.: US 11,846,676 B2
(45) Date of Patent: Dec. 19, 2023

(54) METHOD AND APPARATUS FOR PREDICTING REMAINING CHARGING TIME AND STORAGE MEDIUM

(71) Applicant: BEIJING XIAOMI MOBILE SOFTWARE CO., LTD., Beijing (CN)

(72) Inventors: Changyu Sun, Beijing (CN); Chaoxi Chen, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 17/520,442

(22) Filed: Nov. 5, 2021

(65) Prior Publication Data

US 2022/0308114 A1    Sep. 29, 2022

(30) Foreign Application Priority Data

Mar. 29, 2021   (CN) .......................... 202110331509.4

(51) Int. Cl.
    *G01R 31/382*    (2019.01)
    *H02J 7/00*      (2006.01)
(52) U.S. Cl.
    CPC .......... *G01R 31/382* (2019.01); *H02J 7/0048* (2020.01)
(58) Field of Classification Search
    CPC ...... G01R 31/382; H02J 7/0048; B60L 53/14; B60L 53/66; G06F 1/3203; G06F 11/327; Y02D 10/00

USPC ........ 324/425–435, 415, 76.11, 126, 756.05, 324/538, 200, 530, 207.13, 233, 256, 515, 324/500–750.6

See application file for complete search history.

(56) References Cited

U.S. PATENT DOCUMENTS

| | | | |
|---|---|---|---|
| 2014/0067151 A1* | 3/2014 | Erhart ............... | H02J 13/00034 700/297 |
| 2015/0249355 A1 | 9/2015 | Takano et al. | |
| 2016/0357654 A1* | 12/2016 | de la Cropte de Chantérac ......... | G06F 1/3212 |
| 2021/0119274 A1* | 4/2021 | Watanabe ........... | H02J 7/00308 |

FOREIGN PATENT DOCUMENTS

| | | |
|---|---|---|
| EP | 3764114 A1 | 1/2021 |
| WO | 2019026143 A1 | 2/2019 |

* cited by examiner

*Primary Examiner* — Lee E Rodak
*Assistant Examiner* — Trung Q Nguyen
(74) *Attorney, Agent, or Firm* — Arch & Lake LLP (57) ABSTRACT

A method for predicting remaining charging time, including: obtaining a current state of charge; determining a reference remaining time and a delay time according to the current state of charge; and determining a current remaining charging time according to the reference remaining time and the delay time.

13 Claims, 6 Drawing Sheets

METHOD AND APPARATUS FOR PREDICTING REMAINING CHARGING TIME AND STORAGE MEDIUM

CROSS REFERENCE TO RELATED APPLICATIONS

The present application is based on and claims priority of the Chinese Patent Application No. 202110331509.4, filed on Mar. 29, 2021, the entire content of which is incorporated herein by reference for all purposes.

BACKGROUND

An electronic device such as a smartphone can predict its remaining charging time during charging. With development of a quick charging technology, charging power of the electronic device is increasingly high, charging becomes faster and faster, but a method for predicting remaining charging time in the related art has large errors.

Sometimes, time for fully charging the electronic device in a quick charging mode is usually within one to two hours. When the large errors of the remaining charging time prediction occur, the method for predicting remaining charging time cannot accurately predict the remaining charging time in the quick charging mode, and thus may affect user experience.

SUMMARY

The present disclosure provides a method and apparatus for predicting remaining charging time and a storage medium.

A first aspect of an example of the present disclosure provides a method for predicting remaining charging time. The method may include: obtaining a current state of charge; determining a reference remaining time and a delay time according to the current state of charge; and determining a current remaining charging time according to the reference remaining time and the delay time.

A second aspect of an example of the present disclosure provides an electronic device. The device may include a processor; and a memory, configured to store executable instructions of the processor; wherein the processor may be configured to perform obtaining a current state of charge, predicting remaining charging time where predicting remaining charging time may include obtaining a current state of charge; determining a reference remaining time and a delay time according to the current state of charge; and determining a current remaining charging time according to the reference remaining time and the delay time.

A third aspect of an example of the present disclosure provides a non-transitory computer readable storage medium, wherein when instructions stored in the computer readable storage medium are executed by a processor of an electronic device, and the electronic device performs predicting remaining charging time, wherein the processor may be configured to perform obtaining a current state of charge, predicting remaining charging time where predicting remaining charging time may include obtaining a current state of charge; determining a reference remaining time and a delay time according to the current state of charge; and determining a current remaining charging time according to the reference remaining time and the delay time.

It should be understood that the above general description and the following detailed description are only exemplary and explanatory but not limit the present disclosure.

BRIEF DESCRIPTION OF THE DRAWINGS

Accompanying drawings here, which are incorporated in and constitute a part of this specification, illustrate examples consistent with the present disclosure and, together with the description, serve to explain principles of the present disclosure.

DETAILED DESCRIPTION

Some examples will be described in detail here, examples of which are shown in accompanying drawings. Unless otherwise stated, same reference numbers in the different drawings represent same or similar elements when the following description concern the drawings. Described implementations in the examples below do not represent all implementations consistent with the present disclosure and are only examples.

An electronic device such as a smartphone can predict its remaining charging time during charging. With development of a quick charging technology, charging power of the electronic device is increasingly high, and charging becomes faster and faster.

Sometimes, time for fully charging the electronic device in a quick charging mode is usually within one to two hours. Under the large errors of the remaining charging time prediction, the method for predicting remaining charging time cannot accurately predict the remaining charging time in the quick charging mode, thus affecting user experience.

It is found in a research that factors causing inaccurate prediction of the remaining charging time by the prediction method may include:

Sometimes, the charging power is low, and in a constant current-constant voltage charging process, a ratio of a constant current is large, and a ratio of a constant voltage is small, so that, electric quantity prediction is usually performed through a constant current portion with the neglect of a constant voltage portion.

This prediction method has no obvious errors when the charging power is low. However, in a quick charging technology with high charging power, the ratio of the constant voltage portion is large, and a problem of inaccurate prediction may be caused by the neglect of the constant voltage portion during prediction.

The present disclosure provides a method for predicting remaining charging time including: a current state of charge is obtained; a reference remaining time and a delay time are determined according to the current state of charge; and a current remaining charging time is determined according to the reference remaining time and the delay time. By means of the method of the present disclosure, prediction is performed on the basis of a whole charging stage, and delay factors in a charging process are explored. Though in the quick charging mode, the remaining charging time can be predicted more accurately, and the user experience is effectively improved.

In some examples, the example provides a method for predicting remaining charging time applied to an electronic device. The electronic device may be, for example, a mobile phone, a tablet PC, a laptop or a wearable device and the like.

Figure 1:
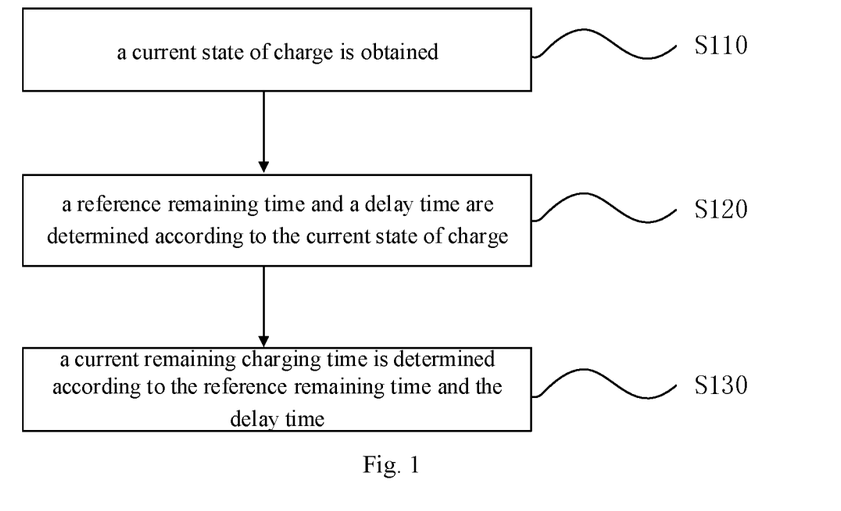
FIG. 1 is a flow chart of a method shown according to an example.

As shown in FIG. 1, the method in the example may include the following steps:

S110, a current state of charge is obtained.

S120, a reference remaining time and a delay time are determined according to the current state of charge.

S130, a current remaining charging time is determined according to the reference remaining time and the delay time.

In S110, there may be many methods for obtaining the state of charge (SOC) in the electronic device.

For example, a current value is measured through a sensor (e.g., a voltameter), and the SOC is worked out synchronously according to the current value in the sensor. For another example, through a chip integrated with an algorithm, the current value detected by the voltameter is obtained, and then the SOC is calculated independently.

When the electronic device is in a charging (e.g., quick charging) process, a processor of the electronic device may obtain the SOC at any moment. The current state of charge in this step may be, for example, the current SOC corresponding to a current moment (T_start): SOC0.

In S120, a memory in the electronic device stores a corresponding relation between the SOC and the charging time. When any one SOC is known, a charging time corresponding to the known SOC may be known through the corresponding relation. Then the current remaining charging time is determined in combination with a total charging duration.

It can be understood that a charging capacity of a battery in the electronic device is certain, and when a charging temperature of the electronic device is within a preset range, the total charging duration of the electronic device is certain. For example, when the charging temperature of the electronic device is always within a safety range, the electronic device may not take temperature control measures in the quick charging process due to temperature change control and may be quickly charged all the way according to the reference charging curve shown in FIG. 7 with the total charging duration (T_full) being 60 min.

Figure 9:
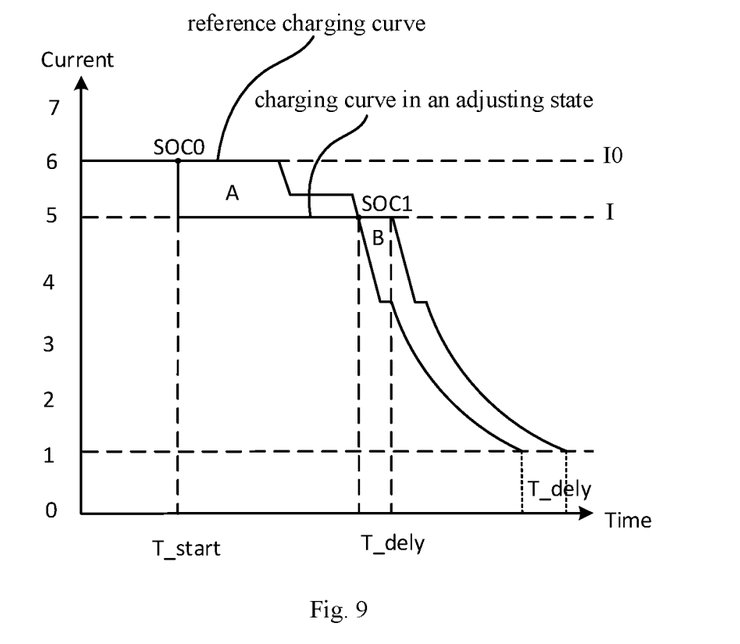
FIG. 9 is a schematic diagram of change of charging current shown according to some examples of the disclosure.

The delay time may be that, for example, in the charging process, the processor of the electronic device triggers temperature control adjusting measures according to a problem of temperature rise of the electronic device or the battery, and controls or adjusts a charging current or a charging flow, and thus an adjusting state is entered. As shown in FIG. 9, charging in the adjusting state causes change of the total charging duration compared with charging according to the reference charging curve, and thus the delay time is generated. When the electronic device does not take the temperature control measures, the delay time may be, for example, 0.

In S130, the current remaining charging time is determined according to the reference remaining time and the delay time in S120.

For example, when the delay time is 0, the current remaining charging time is the reference remaining time.

For another example, when the delay time is not 0, the current remaining charging time is a sum of the reference remaining time and the delay time.

Figure 2:
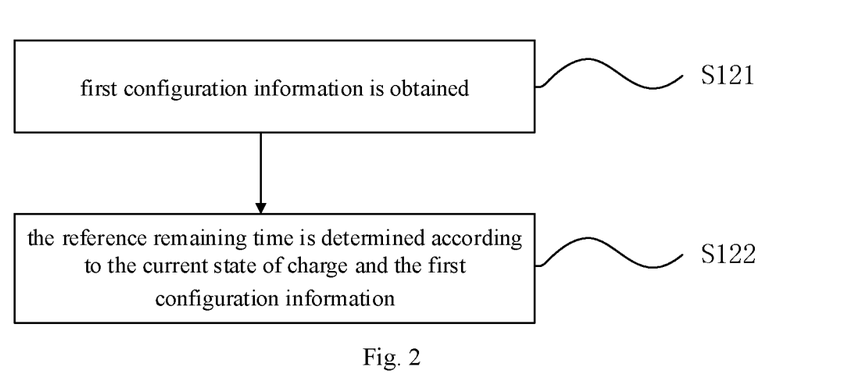
FIG. 2 is a flow chart of a method shown according to some examples of the disclosure.

In some examples, as shown in FIG. 2, S120 in the example may include the following steps:

S121, first configuration information is obtained.

S122, the reference remaining time is determined according to the current state of charge and the first configuration information.

In S121, the first configuration information is configured to represent the corresponding relation between the SOC and the charging time. The first configuration information may be stored in the memory of the electronic device, and the processor may obtain the first configuration information as required.

Figure 8:
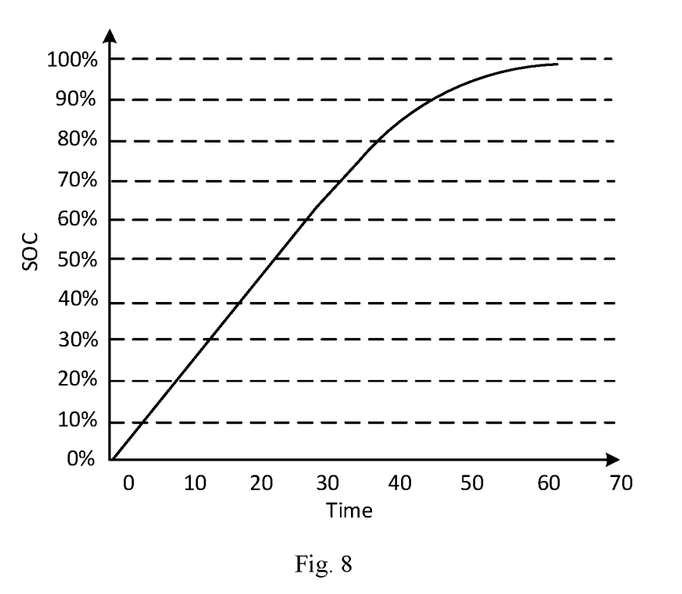
FIG. 8 is a schematic diagram of first configuration information shown according to some examples of the disclosure.

The corresponding relation contained in the first configuration information may be, for example, a function curve corresponding relation between the state of charge and the charging time shown in FIG. 8 or a table of a mapping corresponding relation between the state of charge and the charging time.

In S122, according to the first configuration information, when the current state of charge (SOC0) is known, the charging time (T_start) corresponding to the current state of charge (SOC0) in the first configuration information may be determined in a traversal inquiry mode.

Figure 3:
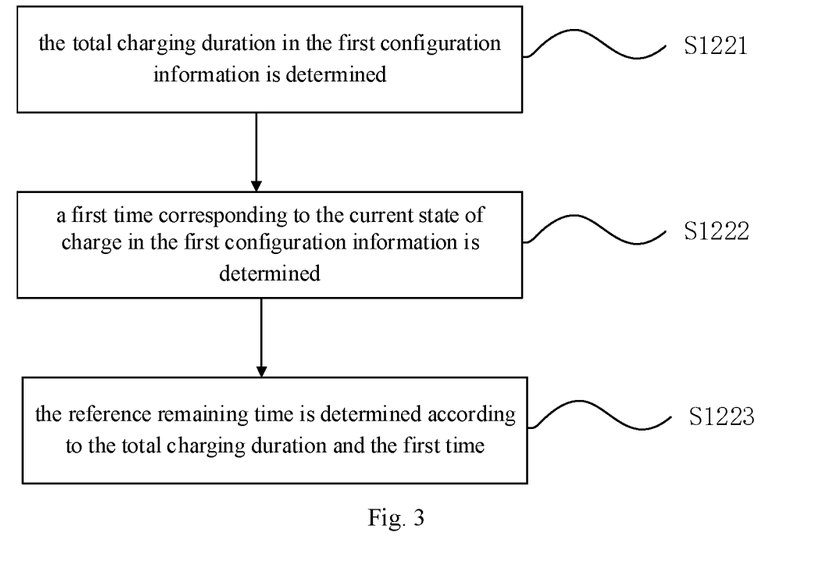
FIG. 3 is a flow chart of a method shown according to some examples of the disclosure.

In this step, as shown in FIG. 3, determining the reference remaining time may include the following steps:

S1221, the total charging duration in the first configuration information is determined.

S1222, a first time corresponding to the current state of charge in the first configuration information is determined.

S1223, the reference remaining time is determined according to the total charging duration and the first time.

In S1221, the processor may determine the total charging duration in the first configuration information after obtaining the first configuration information. For example, as shown in FIG. 8, the corresponding relation between the SOC and the charging time is stored in the first configuration information, and the total charging duration may be known. The first configuration information may correspond to a basic charging curve shown in FIG. 7, and the total charging duration in the first configuration information is the same as a total charging duration in the basic charging curve. The total charging duration (T_full) in the first configuration information is 60 min.

In S1222, the first time is the charging time in the first configuration information corresponding to the current state of charge (SOC0). For example, as shown in FIG. 9, the first time is T_start.

In S1223, a difference value between the total charging duration (T_full) and the first time (T_start) is the reference remaining time (T_RM0). Namely, the reference remaining time T_RM0=T_full−T_start.

In some examples, the method of the example further includes:

S100, the first configuration information is determined.

This step may be, for example, performed in an ex-factory test of the electronic device and stored in the electronic device, or is determined after receiving a charging cable access signal and stored in the electronic device, or is determined before S121 and stored in the electronic device.

Figure 4:
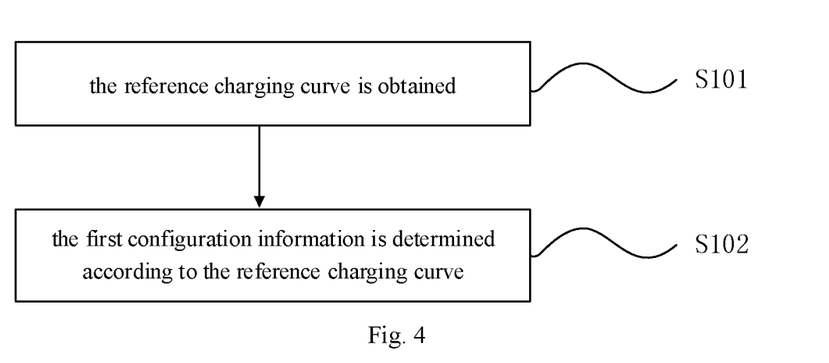
FIG. 4 is a flow chart of a method shown according to some examples of the disclosure.

As shown in FIG. 4, S100 may include the following steps:

S101, the reference charging curve is obtained.

S102, the first configuration information is determined according to the reference charging curve.

Figure 7:
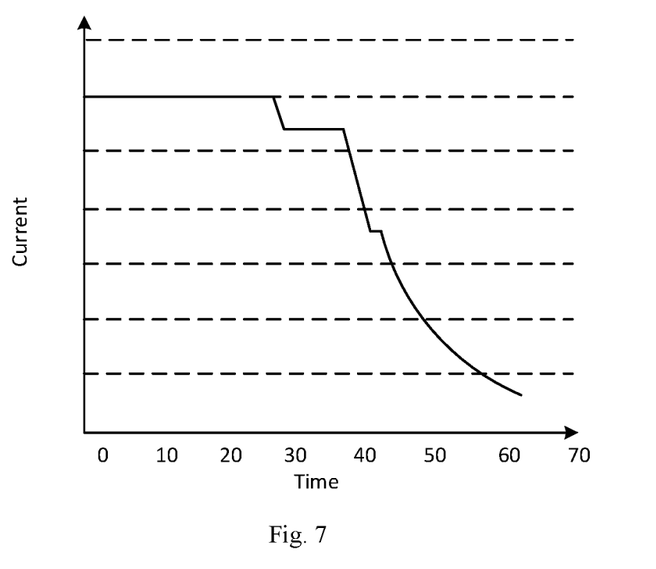
FIG. 7 is a schematic diagram of a reference charging curve shown according to some examples of the disclosure.

In S101, as shown in FIG. 7, the reference charging curve represents the corresponding relation between the charging current and the charging time. The reference charging curve may be, for example, pre-stored in the memory or a power management chip, and the power management chip may charge the battery according to the reference charging curve under a control signal of the processor.

In S102, an SOC value of the battery is obtained through integration of a current integration method (or an ampere-hour integration method) according to the charging current and the charging time represented by the reference charging curve. Thus, the corresponding relation between the SOC and the charging time is obtained, namely, the first configuration information shown in FIG. 8 is determined. In combination with FIG. 7 and FIG. 8, the charging time in the first configuration information is in one-to-one correspondence with the charging time of the reference charging curve.

In some examples, the method of the example further includes:

S200, second configuration information is determined.

This step may be, for example, performed in the ex-factory test of the electronic device and stored in the electronic device, or is determined after receiving a charging cable access signal and stored in the electronic device, or is determined after S100 and stored in the electronic device.

In the example, S200 may include the following steps:

the second configuration information is determined according to the reference charging curve and the first configuration information.

The second configuration information is configured to represent a corresponding relation between the state of charge (SOC) and the charging current.

The first configuration information represents the corresponding relation between the SOC and the charging time, and the reference charging curve represents the corresponding relation between the charging current and the charging time. The corresponding relation between the SOC and the charging current may be known according to a feature that the charging time in the first configuration information is in one-to-one correspondence with the charging time of the reference charging curve.

Figure 5:
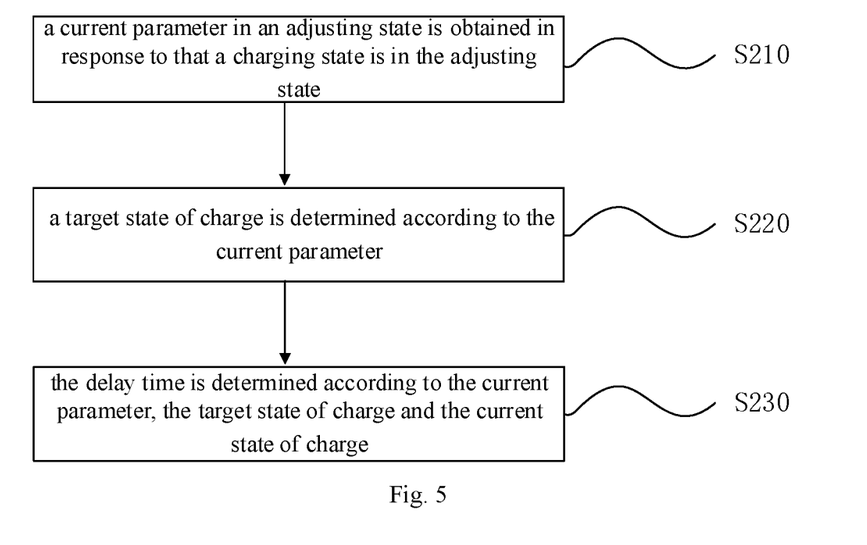
FIG. 5 is a flow chart of a method shown according to some examples of the disclosure.

In some examples, as shown in FIG. 5, the method of the example further includes the following steps:

S210, a current parameter in an adjusting state is obtained in response to that a charging state is in the adjusting state.

S220, a target state of charge is determined according to the current parameter.

In the example, determining the delay time in S120 includes:

S230, the delay time is determined according to the current parameter, the target state of charge and the current state of charge.

The method of the example is configured to determine the delay time mentioned in S120.

In S210, the adjusting state may be, for example, a state that in the charging process, the processor of the electronic device takes the temperature control adjusting measures according to a problem of too large temperature rise of the electronic device or the battery in the charging process, so that the charging current or the charging flow is adjusted. It can be understood that in the quick charging process, the adjusting state aims to avoid a danger caused by too quick temperature rise of the battery or the electronic device. Thus, in the adjusting state, based on the reference charging curve, the processor of the electronic device may control to reduce the charging current in a constant current stage.

For example, as shown in FIG. 9, in the adjusting state, at the first time (T_start) corresponding to the SOC0, the charging current will be reduced from I0 to I, and charging continues with the charging current being I.

In this step, the current parameter may be, for example, the charging current collected by the voltameter in the adjusting state. The processor obtains the charging current. In order to guarantee the accuracy of the current parameter, the current parameter may be that, for example, the charging current within a preset time range (e.g., may be 30 s) containing the T_start is collected, and an average current I_ave corresponding to the preset time range is obtained and used as the current parameter I in this step. It can be understood that fluctuation of the charging current collected within the preset time range should be within a preset range, and if fluctuation is large, the charging current needs to be collected again for predication.

In S220, the target state of charge is configured to represent a state of charge corresponding to a second time when the charging current in the adjusting state coincides with the reference charging curve. As shown in FIG. 9, two time points when the charging current in the adjusting state coincides with the reference charging curve exist, the first time (T_start) corresponds to the current state of charge (SOC0), and the second time corresponds to the target state of charge (SOC1).

In an example, according to the current parameter I, the processor may obtain the target state of charge SOC1 corresponding to the current parameter I. In other examples, according to the second time, the processor may obtain the target state of charge (SOC1) corresponding to the second time.

Figure 6:
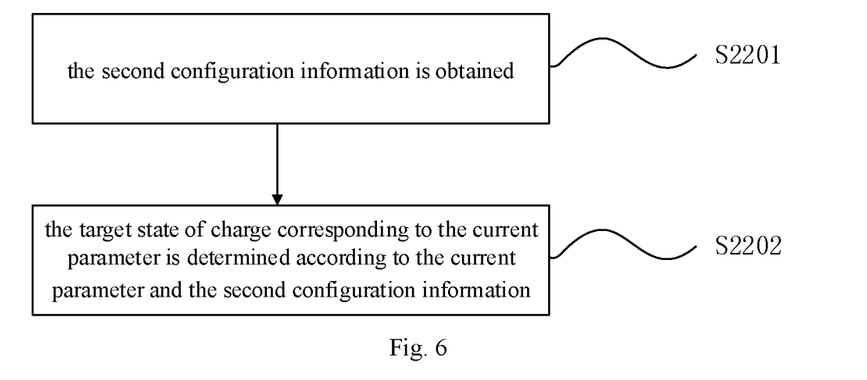
FIG. 6 is a flow chart of a method shown according to some examples of the disclosure.

In the example, as shown in FIG. 6, S220 may include the following steps:

S2201, the second configuration information is obtained.

In this step, the second configuration information is configured to represent the corresponding relation between the state of charge and the charging current. The second configuration information may be, for example, determined in S200 of the aforementioned example, pre-stored in the memory of the electronic device before S220 and obtained by the processor of the electronic device in S220.

S2202, the target state of charge corresponding to the current parameter is determined according to the current parameter and the second configuration information. In this step, when the current parameter is known, the target state of charge in the second configuration information corresponding to the current parameter may be determined in a traversal inquiry mode.

In S230, the current parameter is marked by I, the target state of charge is marked by SOC1, the current state of charge is marked by SOC0, besides, a capacity of the battery of the electronic device is marked by $Q_{max}$, and the delay time is marked by T_delay. The delay time is related to the above parameters and may be determined according to the above parameters.

A specific calculation principle is as follows:

as shown in FIG. 9, a charging curve in the adjusting state differs from the basic charging curve, and a difference region includes a region A and a region B. As a total area of a region defined by the charging curve in the adjusting state and coordinate axes is equal to a total area of a region defined by the basic charging curve and the coordinate axes, a loss area SA (namely, an electric quantity $Q_A$ corresponding to the region A) caused by current reducing in the adjusting state is equal to a delay area $S_B$ (namely, an electric quantity $Q_B$ corresponding to the region B) caused by current reducing in the adjusting state, namely, $Q_A=Q_B$.

It is known that $Q_A=(SOC1-SOC0)*Q_{max}$. As shown in FIG. 9, $S_B$ is equivalent to an area of a rectangle shown by dotted line. Thus, $Q_B=I*T\_delay$.

On the basis of the above three equation relations, $T\_delay=(SOC1-SOC0)*Q_{max}/I$ may be obtained. Thus, the delay time may be determined.

Based on the delay time T_delay determined in this step and the reference remaining time T_RM0 determined in the aforementioned example, a prediction result may be determined. The current remaining charging time T is sum of the reference remaining time and the delay time, namely:

T=T_RM0+T_delay=T_full−T_start+T_delay, where, T_full is the total charging duration, and T_start is the charging time corresponding to the current state of charge (SOC0).

In an example, when T_delay=0, namely, when the electronic device does not enter the adjusting state, $Q_A=Q_B=0$, SOC1=SOC0, and I=I0, wherein I is the current parameter (an average charging current) in the adjusting state, and JO is a reference charging current in the reference charging curve corresponding to I.

In another example, when T_delay>0, namely, when the electronic device enters the adjusting state, $Q_A=Q_B>0$, SOC1≠SOC0, and I<I0.

Through the prediction method provided in the example of the present disclosure, predication is performed on the basis of all stages (constant voltage or constant current) of the reference charging curve, the influence of the charging current to the charging time is explored more comprehensively, and the method is suitable for the quick charging mode. Meanwhile, the present disclosure further explores change of the charging state under the influence of temperature rise of the electronic device or the battery, the influence of the delay time is determined during the remaining charging time prediction, and thus the remaining charging time is predicted more accurately.

Figure 10:
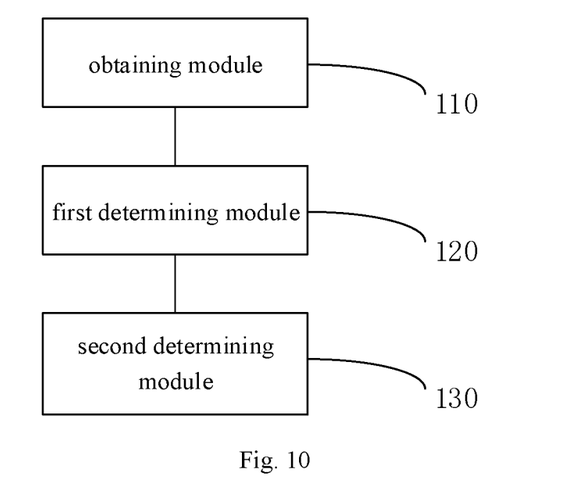
FIG. 10 is a block diagram of an apparatus shown according to an example.

In some examples, the present disclosure further provides an apparatus for predicting remaining charging time, as shown in FIG. 10, including: an obtaining module 110, a first determining module 120 and a second determining module 130. The apparatus of the example is configured to implement the method shown in FIG. 1. The obtaining module 110 is configured to obtain a current state of charge. The first determining module 120 is configured to determine a reference remaining time and a delay time according to the current state of charge. The second determining module 130 is configured to determine a current remaining charging time according to the reference remaining time and the delay time.

In some examples, as shown in FIG. 10, the apparatus of the example includes the obtaining module 110, the first determining module 120 and the second determining module 130 and is configured to implement the method shown in FIG. 2. The first determining module 120 is configured to obtain first configuration information and determine the reference remaining time according to the current state of charge and the first configuration information, wherein the first configuration information is configured to represent a corresponding relation between a state of charge and a charging time. In the example, the first determining module 120 is configured to determine a total charging duration in the first configuration information; determine a first time corresponding to the current state of charge in the first configuration information; and determine the reference remaining time according to the total charging duration and the first time.

In some examples, the apparatus of the example further includes a third determining module configured to determine the first configuration information. The third determining module is configured to obtain a reference charging curve and determine the first configuration information according to the reference charging curve, wherein the reference charging curve is configured to represent a corresponding relation between the charging current and the charging time, the charging time in the first configuration information is in one-to-one correspondence with the charging time of the reference charging curve. In the example, the third determining module is further configured to determine second configuration information, specifically, the second configuration information is determined according to the reference charging curve and the first configuration information, wherein the second configuration information is configured to represent a corresponding relation between the state of charge and the charging current.

In some examples, as shown in FIG. 10, the apparatus of the example includes the obtaining module 110, the first determining module 120 and the second determining module 130 and is configured to implement the method shown in FIG. 5. The obtaining module 110 is further configured to obtain a current parameter in an adjusting state in response to that a charging state is in the adjusting state. The first determining module 120 is further configured to determine a target state of charge, wherein the target state of charge is configured to represent a state of charge corresponding to a second time when the charging current in the adjusting state coincides with the reference charging curve. The first determining module 120 is further configured to determine a delay time according to the current parameter, the target state of charge and the current state of charge. In the example, the first determining module 120 is configured to obtain the second configuration information and determine the target state of charge corresponding to the current parameter according to the current parameter and the second configuration information, wherein the second configuration information is configured to represent a corresponding relation between the state of charge and the charging current.

Figure 11:
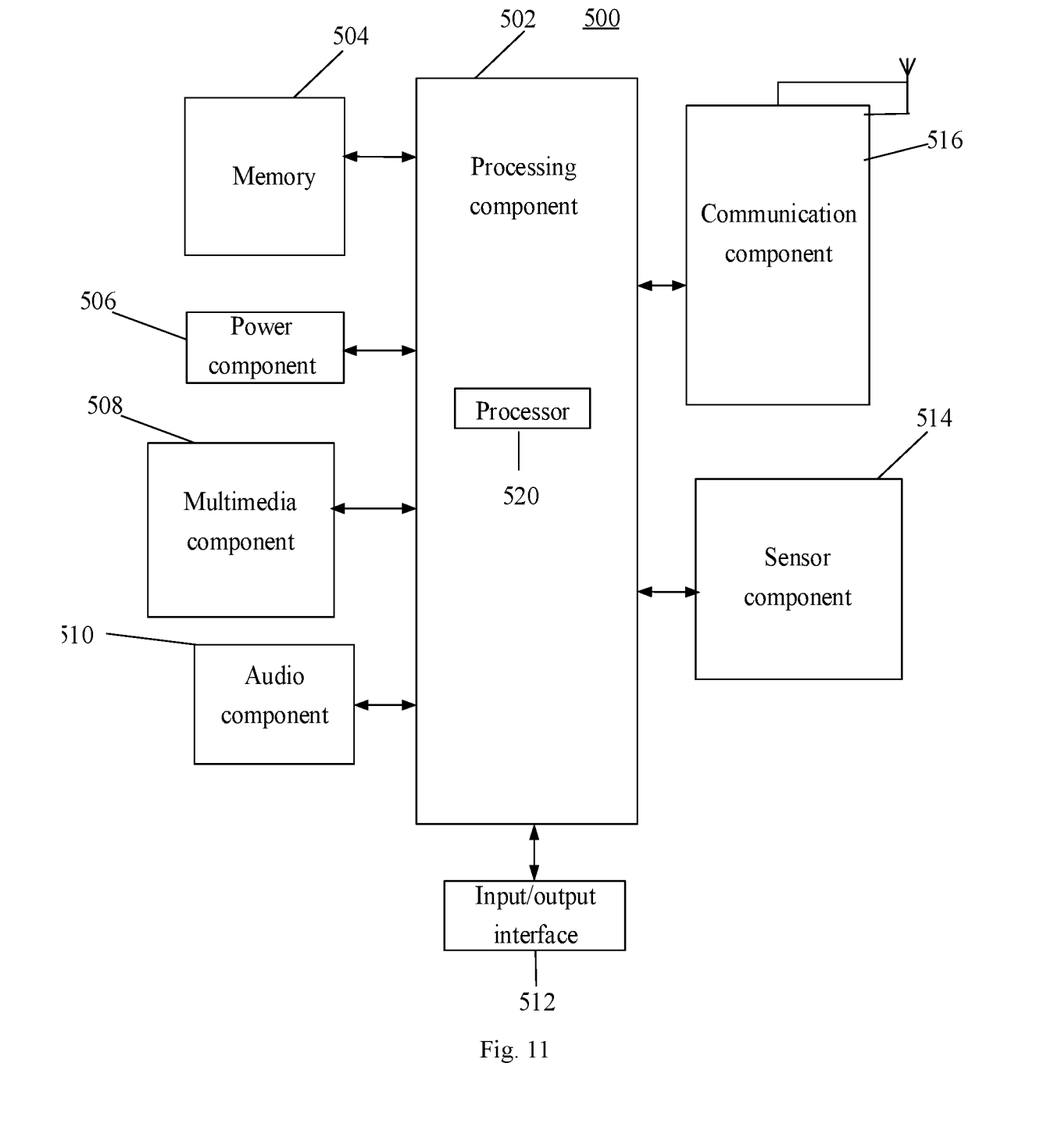
FIG. 11 is a block diagram of an electronic device shown according to an example.

As shown in FIG. 11 is a block diagram of an electronic device. The present disclosure further provides an electronic device. For example, the device 500 may be a mobile phone, a computer, a digital broadcasting terminal, a message transmitter-receiver, a game console, a tablet device, a medical device, a fitness facility, a personal digital assistant and the like.

The device 500 may include the following one or more components: a processing component 502, a memory 504, a power component 506, a multimedia component 508, an audio component 510, an input/output (I/O) interface 512, a sensor component 514 and a communication component 516.

The processing component 502 usually controls whole operation of the device 500 such as operations related to display, telephone call, data communication, camera operation and recording operation. The processing component 502 may include one or more processors 520 for executing instructions so as to complete all or part of steps of the above method. Besides, the processing component 502 may include one or more modules so as to facilitate interaction between the processing component 502 and the other components. For example, the processing component 502 may include a multimedia module so as to facilitate interaction between the multimedia component 508 and the processing component 502.

The memory 504 is configured to store various data so as to support operations on the device 500. Examples of these data include instructions of any application or method, contact data, telephone directory data, messages, pictures, videos and the like for operations on the device 500. The memory 504 may be realized by any type of volatile or non-volatile storage device or their combinations such as a static random access memory (SRAM), an electrically erasable programmable read-only memory (EEPROM), an electrically programmable read-only memory (EPROM), a programmable read-only memory (PROM), a read-only memory (ROM), a magnetic memory, a flash memory, a magnetic disc or a compact disc.

The power component 506 provides power for all the components of the device 500. The power component 506 may include a power management system, one or more power sources, and other components related to generation, management and distribution of power for the device 500.

The multimedia component 508 includes a screen for providing an output interface between the device 500 and a user. In some examples, the screen may include a liquid crystal display (LCD) and a touch panel (TP). If the screen includes the touch panel, the screen may be a touch screen so as to receive an input signal from the user. The touch panel includes one or more touch sensors to sense touching, swiping and gestures on the touch panel. The touch sensors may not only sense boundaries of touching or swiping actions, but detect duration and pressure related to the touching or swiping operation. In some examples, the multimedia component 508 includes a front camera and/or back camera. When the device 500 is in an operation mode such as a shooting mode or a video mode, the front camera and/or the back camera may receive external multimedia data. Each front camera or back camera may be a fixed optical lens system or have a focal length and an optical zoom capability.

The audio component 510 is configured to output and/or input an audio signal. For example, the audio component 510 includes a microphone (MIC). When the device 500 is in the operation mode such as a call mode, a recording mode and a voice recognition mode, the microphone is configured to receive an external audio signal. The received audio signal may be further stored in the memory 504 or sent via the communication component 516. In some examples, the audio component 510 further includes a loudspeaker configured to output the audio signal.

The I/O interface 512 provides an interface between the processing component 502 and a peripheral interface module. The peripheral interface module may be a keyboard, a click wheel, buttons and the like. These buttons may include but are not limited to a home button, a volume button, a start button and a lock button.

The sensor component 514 includes one or more sensors for providing state evaluations of various aspects for the device 500. For example, the sensor component 514 may detect a start/shutdown state of the device 500, and relative position of components, for example, the components are a display and a keypad of the device 500. The sensor component 514 may further detect position change of the device 500 or one of the components of the device 500, contact or no contact of the user and the device 500, orientation or speed-up/slow-down and temperature change of the device 500. The sensor component 514 may include a proximity sensor, configured to detect presence of nearby objects without any physical contact. The sensor component 514 may further include a photosensor such as a CMOS or CCD image sensor for use in an imaging application. In some examples, the sensor component 514 may further include an acceleration sensor, a gyroscope sensor, a magnetic sensor, a pressure sensor or a temperature sensor.

The communication component 516 is configured to facilitate wired or wireless communication between the device 500 and other devices. The device 500 may access to a wireless network based on a communication standard, for example, WiFi, 2G or 3G or their combination. In some examples, the communication component 516 receives a broadcast signal or related broadcast information from an external broadcast management system via a broadcast channel. In some examples, the communication component 516 further includes a near field communication (NFC) module so as to facilitate short-range communication. For example, the NFC module may be realized based on a radio frequency identification (RFID) technology, an infrared data association (IrDA) technology, an ultra wide band (UWB) technology, a Bluetooth (BT) technology and other technologies.

In some examples, the device 500 may be realized by one or more application-specific integrated circuits (ASICs), a digital signal processor (DSP), a digital signal processing device (DSPD), a programmable logic device (PLD), a field-programmable gate array (FPGA), a controller, a microcontroller, a microprocessor or other electronic elements for executing the above method.

Another example of the present disclosure provides a computer readable storage medium, for example, a memory 504 including instructions, wherein the instructions may be executed by a processor 520 of a device 500 to complete the above method. For example, the computer readable storage medium may be ROM, a random access memory (RAM), a CD-ROM, a magnetic tape, a floppy disk, an optical data storage device and the like. When the instructions in the computer readable storage medium are executed by the processor of the electronic device, the electronic device may execute the above method.

According to a first aspect of an example of the present disclosure, a method for predicting remaining charging time includes:

obtaining a current state of charge;

determining a reference remaining time and a delay time according to the current state of charge; and     determining a current remaining charging time according to the reference remaining time and the delay time.

According to a second aspect of an example of the present disclosure, an apparatus for predicting remaining charging time includes:

an obtaining module, configured to obtain a current state of charge;

a first determining module, configured to determine a reference remaining time and a delay time according to the current state of charge; and a second determining module, configured to determine a current remaining charging time according to the reference remaining time and the delay time.

According to a third aspect of an example of the present disclosure, an electronic device includes:

a processor; and a memory, configured to store executable instructions of the processor; wherein the processor is configured to execute the method for predicting remaining charging time mentioned above.

According to a fourth aspect of an example of the present disclosure, a non-transitory computer readable storage medium is provided, wherein when instructions in the computer readable storage medium are executed by a processor of an electronic device, the electronic device can execute the method for predicting remaining charging time mentioned above.

Technical solutions provided by the examples of the present disclosure may include the following beneficial effects: by means of the method of the present disclosure, prediction is performed on the basis of a whole charging stage, and delay factors during charging are explored. Though in the quick charging mode, the remaining charging time can be still predicted more accurately, and user experience is effectively improved.

The present disclosure may include dedicated hardware implementations such as disclosure specific integrated circuits, programmable logic arrays and other hardware devices. The hardware implementations can be constructed to implement one or more of the methods described herein. Examples that may include the apparatus and systems of various implementations can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

Those skilled in the art can easily figure out other implementations after considering the description and practicing the present disclosure. The present application intends to cover any modifications, applications or adaptive changes of the present disclosure. These modifications, applications or adaptive changes conform to a general principle of the present disclosure and include common knowledge or habitual technical means in the technical field not disclosed by the present disclosure. The description and the examples are only constructed as being exemplary.

It can be understood that the present disclosure is not limited to accurate structures descried above and shown in the drawings and can allow various changes and modifications without departing from its scope.

What is claimed is:

1. A method for predicting remaining charging time, comprising:

obtaining, by a processor of an electronic device, a current state of charge of the electronic device, wherein the electronic device comprises a sensor and the processor, and the current state of charge is calculated based on a current value detected by the sensor;

obtaining a current parameter collected by the sensor in an adjusting state in response to a charging state being in the adjusting state;

determining, by the processor of the electronic device, a target state of charge, wherein the target state of charge is configured to represent a state of charge corresponding to a second time in response to determining that the charging current in the adjusting state coincides with a reference charging curve;

determining, by the processor of the electronic device, a reference remaining time according to the current state of charge;

determining, by the processor of the electronic device, a delay time according to the current parameter, the target state of charge, and the current state of charge, wherein the delay time is change of the total charging duration caused by temperature control measure for the electronic device during charging; and determining, by the processor of the electronic device, a current remaining charging time of the electronic device according to the reference remaining time and the delay time to charge a battery of the electronic device according to the current remaining charging time.

2. The method according to claim 1, wherein determining the reference remaining time according to the current state of charge comprises:

obtaining first configuration information, wherein the first configuration information is configured to represent a corresponding relation between a state of charge and a charging time; and determining the reference remaining time according to the current state of charge and the first configuration information.

3. The method according to claim 2, wherein determining the reference remaining time according to the current state of charge and the first configuration information comprises:

determining a total charging duration in the first configuration information;

determining a first time corresponding to the current state of charge in the first configuration information; and determining the reference remaining time according to the total charging duration and the first time.

4. The method according to claim 2, further comprising:

obtaining the reference charging curve, wherein the reference charging curve is configured to represent a corresponding relation between a charging current and a charging time; and determining the first configuration information according to the reference charging curve, wherein the charging time in the first configuration information is in one-to-one correspondence with the charging time of the reference charging curve.

5. The method according to claim 4, further comprising:

determining a second configuration information according to the reference charging curve and the first configuration information; and wherein the second configuration information is configured to represent a corresponding relation between the state of charge and the charging current.

6. The method according to claim 1, wherein determining the target state of charge comprises:

obtaining second configuration information, wherein the second configuration information is configured to represent a corresponding relation between the state of charge and the charging current; and determining the target state of charge corresponding to the current parameter according to the current parameter and the second configuration information.

7. An electronic device, comprising:

a sensor;

a processor; and a memory, configured to store executable instructions of the processor; wherein the processor is configured to perform predicting remaining charging time, and wherein predicting remaining charging time comprises:

obtaining a current state of charge of the electronic device, wherein the current state of charge is calculated based on a current value detected by the sensor;

obtaining a current parameter collected by the sensor in an adjusting state in response to a charging state being in the adjusting state;

determining a target state of charge, wherein the target state of charge is configured to represent a state of charge corresponding to a second time in response to determining that the charging current in the adjusting state coincides with a reference charging curve;

determining a reference remaining time according to the current state of charge;

determining a delay time according to the current parameter, the target state of charge, and the current state of charge, wherein the delay time is change of the total charging duration caused by temperature control measure for the electronic device during charging; and determining a current remaining charging time of the electronic device according to the reference remaining time and the delay time to charge a battery of the electronic device according to the current remaining charging time.

8. The electronic device according to claim 7, wherein the processor configured to perform determining the reference remaining time is further configured to perform:

obtaining first configuration information, wherein the first configuration information is configured to represent a corresponding relation between a state of charge and a charging time; and determining the reference remaining time according to the current state of charge and the first configuration information.

9. The electronic device according to claim 8, wherein the processor configured to perform determining the reference remaining time is further configured to perform:

determining a total charging duration in the first configuration information;

determining a first time corresponding to the current state of charge in the first configuration information; and determining the reference remaining time according to the total charging duration and the first time.

10. The electronic device according to claim 8, wherein the processor is further configured to preform:

obtaining the reference charging curve, wherein the reference charging curve is configured to represent a corresponding relation between a charging current and a charging time; and determining the first configuration information according to the reference charging curve, wherein the charging time in the first configuration information is in one-to-one correspondence with the charging time of the reference charging curve.

11. The electronic device according to claim 10, wherein the processor is further configured to perform:

determining a second configuration information according to the reference charging curve and the first configuration information; and wherein the second configuration information is configured to represent a corresponding relation between the state of charge and the charging current.

12. The electronic device according to claim 7, wherein the processor configured to perform determining the target state of charge is further configured to perform:

obtaining second configuration information, wherein the second configuration information is configured to represent a corresponding relation between the state of charge and the charging current; and determining the target state of charge corresponding to the current parameter according to the current parameter and the second configuration information.

13. A non-temporary computer readable storage medium, wherein when, instructions stored in the computer readable storage medium are executed by a processor of an electronic device, the electronic device perform predicting remaining charging time, wherein predicting remaining charging time comprises:

obtaining a current state of charge of an electronic device, wherein the current state of charge is calculated based on a current value detected by a sensor;

obtaining a current parameter collected by the sensor in an adjusting state in response to determining that a charging state is in the adjusting state;

determining a target state of charge, wherein the target state of charge is configured to represent a state of charge corresponding to a second time in response to determining that the charging current in the adjusting state coincides with a reference charging curve;

determining a reference remaining time according to the current state of charge;

determining a delay time according to the current parameter, the target state of charge, and the current state of charge, wherein the delay time is change of the total charging duration caused by temperature control measure for the electronic device during charging; and determining a current remaining charging time of the electronic device according to the reference remaining time and the delay time to charge a battery of the electronic device according to the current remaining charging time.

* * * * *